United States Patent
Yang et al.

(10) Patent No.: US 9,909,203 B2
(45) Date of Patent: Mar. 6, 2018

(54) NANO-APERTURE FABRICATION USING TEMPLATE GUIDED THERMAL DEWETTING

(71) Applicant: Agency for Science, Technology and Research, Singapore (SG)

(72) Inventors: Joel Kwang Wei Yang, Singapore (SG); Ying Min Wang, Singapore (SG); Mohamed Asbahi, Singapore (SG); Yong-Wei Zhang, Singapore (SG); Liangxing Lu, Singapore (SG); Bharathi Madurai Srinivasan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 60 days.

(21) Appl. No.: 14/873,293

(22) Filed: Oct. 2, 2015

(65) Prior Publication Data

US 2016/0097116 A1    Apr. 7, 2016

Related U.S. Application Data

(60) Provisional application No. 62/058,871, filed on Oct. 2, 2014.

(51) Int. Cl.
| | | |
|---|---|---|
| C23C 10/60 | (2006.01) | |
| C23C 14/16 | (2006.01) | |
| C23C 14/18 | (2006.01) | |
| C23C 14/30 | (2006.01) | |
| C23C 14/58 | (2006.01) | |

(52) U.S. Cl.
CPC .............. *C23C 10/60* (2013.01); *C23C 14/16* (2013.01); *C23C 14/18* (2013.01); *C23C 14/30* (2013.01); *C23C 14/5806* (2013.01)

(58) Field of Classification Search
CPC ........................... C23C 10/60; C23C 14/5806
See application file for complete search history.

(56) References Cited

PUBLICATIONS

Im et al "Noble metal nanoslit by dewetting of thermally activated Au film on CNT" NSTI-Nanotech 2010 vol. 2, 2010, 111-114.*
Repetto et al "Anisotropic Dewetting of Ion Irradiated Solid Films" Nuclear Instruments and Methods in Physics Research B 315 (2013) 244-247.*
Strobel et al "Sub-10nm structures on silicon by thermal dewetting of platinum" Nanotechnology 21, 505301 (2010) 1-7.*

* cited by examiner

*Primary Examiner* — Nathan Empie
(74) *Attorney, Agent, or Firm* — Schwegman Lundberg & Woessner, P.A.

(57) ABSTRACT

A method for fabrication of metal film with nanoapertures is provided. The method includes the steps of providing a nanopatterned template including a plurality of nanostructures, depositing of the metal film onto the nanopatterned template, and thermally induced dewetting of the metal film to define the nanoapertures in the metal film by diffusion and reflow of the metal film.

15 Claims, 7 Drawing Sheets

NANO-APERTURE FABRICATION USING TEMPLATE GUIDED THERMAL DEWETTING

PRIORITY CLAIM

This application claims the benefit of priority of U.S. Provisional Patent Application No. 62/058,871 filed on Oct. 2, 2014, the benefit of priority of which is claimed hereby, and which is incorporated by reference herein in its entirety.

TECHNICAL FIELD

The present invention generally relates to methods and apparatus for nanoaperture fabrication, and more particularly relates to methods and apparatus for nanoaperture fabrication using template guided thermal dewetting.

BACKGROUND OF THE DISCLOSURE

Nanoapertures in metal films at the ten nanometer scale can aid strong plasmonic enhancements that are potentially useful for biological and chemical sensing. Such nanoapertures have also been shown to be applicable to a highly promising method for DNA sequencing and biological and chemical sensing. However, to reliably and cost-effectively manufacture these nanoapertures on commercially-viable scales remains challenging. Current approaches to create such nanoapertures in metal films falls into three major categories—(a) metal evaporation on nanopatterned templates defined by electron beam or photolithography followed by metal liftoff, (b) focused ion beam milling, and (c) wet or dry etching using a nanopatterned mask. There are significant limitations associated with each of these methods as all of these methods have limited throughput, yield and resolution. This is a significant impediment for the commercialization of such devices.

Thus, what is needed is a method for fabrication of nanoapertures in metal film which at least partially overcomes the drawbacks of present approaches and provides improved resolution, yield and throughput. Furthermore, other desirable features and characteristics will become apparent from the subsequent detailed description and the appended claims, taken in conjunction with the accompanying drawings and this background of the disclosure.

SUMMARY

According to at least one embodiment of the present invention a method for fabrication of metal film with nanoapertures is provided. The method includes the steps of providing a nanopatterned template including a plurality of nanostructures, depositing of the metal film onto the nanopatterned template, and thermally induced dewetting of the metal film to define the nanoapertures in the metal film by diffusion and reflow of the metal film.

In accordance with another aspect of at least one embodiment of the present invention, a method for simulating nanoaperture fabrication in metal film is provided. The method includes the step of predicting fabrication yield for the nanoaperture fabrication in the metal film by complementarily performing a phase-field simulation method of the nanoaperture fabrication and an energetic analysis of the nanoaperture fabrication.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

Figure 1:
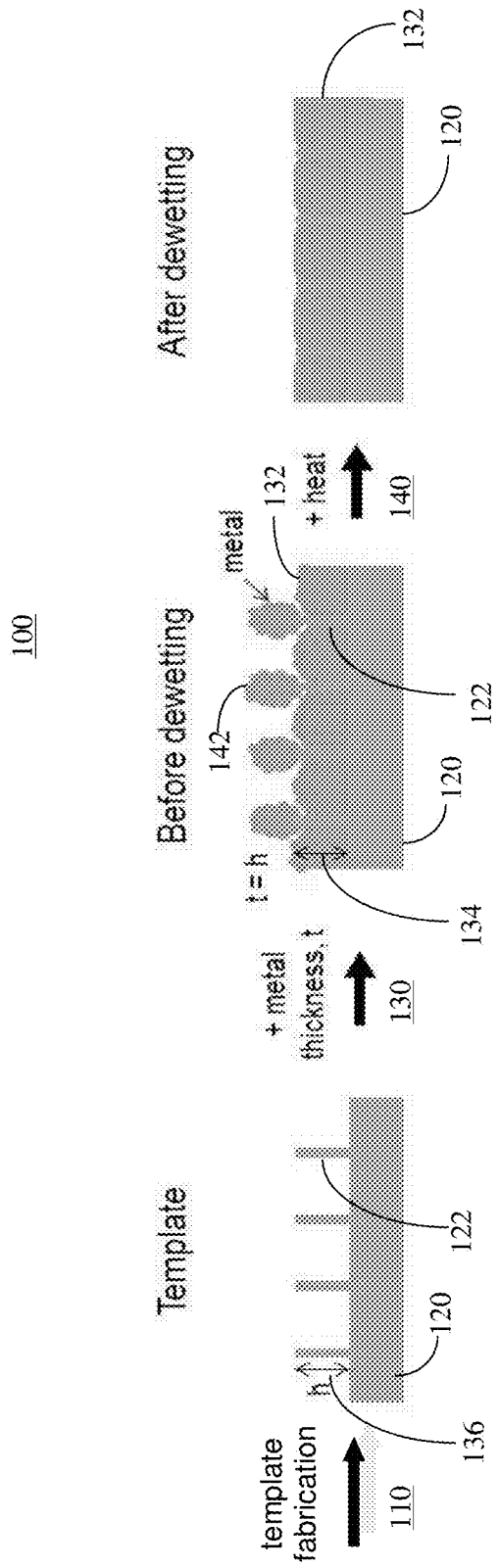
FIG. 1 illustrates a nanoaperture fabrication process in accordance with the present embodiment.

Skilled artisans will appreciate that elements in the figures are illustrated for simplicity and clarity and have not necessarily been depicted to scale. For example, the nanopillars and nanoapertures depicted in FIGS. 1, 3, 4, 5, 6 and 7 are greatly magnified for ease of viewing.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a method for fabrication of nanoapertures in metal film which provides improved resolution, yield and throughput. The method for fabrication of nanoapertures in metal films uses thermally induced metal dewetting from protrusions in nano-patterned templates to provide an easy, high yield robust process. In accordance with the present embodiment, a simulation package that accurately predicts the feasibility of the fabrication process for various nanotemplate configurations is provided which allows fast, cost effective optimization and adaptability of the fabrication process. Fabrication in accordance with the present embodiment provides many improvements over conventional methods for nanoaperture fabrication in metal.

Focused ion-beam milling with heavy ions like gallium and argon beam is one conventional fabrication technique. Focused ion-beam milling is unable to achieve resolution comparable to resolutions currently achievable using typical high-resolution electron beam lithography. In addition, ion contamination during bombardment has been shown to significantly alter the material properties of the metal. Recently, helium beam milling has been utilized to enable sub-ten nanometer fabrication. However, like other focused ion-beam based fabrication methods, helium ion beam milling is much slower than electron beam lithography. In addition, helium ion beam milling suffers from formation of bubbles within the metal substrate due to helium implantation. These disadvantages, along with the cost of ion-beam milling, prohibit the application of ion-beam milling technologies for mass production. Instead, focused ion beam milling is often used only for prototyping. Thus, focused ion-beam milling for nanoaperture fabrication has the disadvantages of ion contamination, time consuming processing, low resolution (typically approximately fifty nanometers), expensive instruments and a lack of potential for mass production.

A second nanoaperture fabrication technique includes dry and wet etching of metal through nanopatterned masks. However, this etching technique presents disadvantages of lack of control and low resolution. Etching processes are difficult to control especially in the ten nanometer scale. Therefore, ten nanometer scale resolution has likely not been achieved. In addition, the sidewall profiles achievable via such methods are usually not straight, limiting achievable resolution. Further, the availability of chemistries for metal etching limits the possibilities of etching some metals.

A third conventional nanoaperture fabrication technique involves metal liftoff. However, metal liftoff provides limited yield, presents a resist thickness versus resolution tradeoff, requires an adhesion layer for poorly adhering metal and can be quite time consuming. Metal liftoff methods involve evaporating metals on nanopatterned templates defined by, for example, electron beam lithography and, then, physically and/or chemically removed the defined nanostructures from the substrate along with the metal on top to obtain apertures. Metal liftoff processes are challenging and time consuming, often limiting process yield. In addition, unsuccessful liftoff leads to missing apertures where desired. Further, undesired liftoff of surrounding features results in larger features than desired.

Also, the liftoff step imposes constraints on the fabrication process. Firstly, in a typical process involving metal liftoff, the thickness of the resist needs to be more than three times the thickness of the metal film deposited to ensure a good yield. The use of thicker resists limits the resolution of the patterning processes, such as electron beam lithography process where electron scattering in thick resists fundamentally limits the ultimate aspect ratio of achievable nano apertures.

Secondly, methods involving metal liftoff require good adhesion of metal to the substrate. Gold, a commonly used noble metal for plasmonics and electronics, for example, does not adhere well to most substrates. An adhesion layer is often required to enhance adhesion to the substrate, compromising the performance of the system (e.g. causing significant damping in plasmonic-based devices formed in this manner).

All three conventional methods are inherently subtractive methods where materials need to be removed. Subtractive methods require that materials at the center of the eventual aperture need to be removed in order to form the aperture. In cases where the aperture needs to be filled with, for example, active materials (e.g., semiconductors, filter materials and phase-change materials such as vanadium oxide) and planarized, additional processes are required making the process of manufacturing complicated and limiting possibilities in the practical realization and manufacturing of active plasmonic device designs by subtractive methods.

Referring to FIG. 1, an illustration 100 depicts a nanoaperture fabrication process in accordance with the present embodiment which includes fabrication 110 of a nanopatterned template 120 including protruding structures 122 through methods such as, but not limited to, electron beam lithography and nanoimprint lithography. Next, metal deposition 130 deposits metal 132 on the template 120 until the height 134 of the metal 132 equals the height 136 of the protruding structures 122. The thickness of the metal is not a strict condition. Next, thermal dewetting 140 heats up the sample to obtain nanoapertures 150 at locations of the protruding structures 122 on the nanopatterned template 120.

The complementary simulation package will derive the optimal nanopatterned template and surface modifications, the thickness 134 of metal to be deposited 130 and the temperature and duration of the thermal dewetting step 140. As an example of materials, hydrogen silsesquioxane (HSQ), a high contrast negative tone resist, can be used to pattern ten nanometer scale features (i.e., the protruding structures 122) on a silicon or glass substrate to nanopattern the template 120. Gold is deposited 130 on the nanopatterened template 120 and, subsequently, the sample is thermally annealed to induce metal dewetting 140 from the HSQ structures. As a result, clear apertures 150 are obtained at the location of the patterned structures 122, surrounded by gold film.

Using energetics analysis with phase-field simulations, the experimental results can be verified and the optimal parameter space for the best yield can be identified. The fabrication process in accordance with the present embodiment is compatible with nanoapertures having dimensions on the scale of ten to fifty nanometers. This technique can be further developed and optimized with the assistance of the simulation package in accordance with the present embodiment, to allow for fabrication of a wider range of aperture structures (e.g. gaps). This process can be easily adapted to other combinations of substrates, nanotemplates and metals. The simulation method provides a fast, accurate and cost-effective method for translation and optimization of this fabrication process to other material systems.

To obtain vacant apertures, the nanopillar material can be removed gently through wet or dry etching. However, unlike conventional processes that require lift-off, the dewetting process allows for the template material to remain. This presents an opportunity for close interfacing of metals to templates of active materials such as quantum dots, nonlinear crystals, epitaxially grown semiconductor nanostructures, nanowires and similar materials. Inherent to the process of annealing, higher crystallinity in the patterned gold nanofilm can be obtained, which is advantageous for electric and plasmonic devices.

The fabrication process in accordance with the present embodiment is uniquely suited for applications such as the fabrication of active nanoplasmonic-based devices with sharp resonances and high sensitivity. In particular, the small length scales achievable (e.g., 10 nm scale) uniquely positions the fabrication process in accordance with the present embodiment for plasmonics/metaloptics applications such as developing transmission based devices at ultrashort wavelengths (<200 nm). In addition, the fabrication process in accordance with the present embodiment is suitable for fabrication of nano-sieves and nanopores for applications such as biosensing and DNA sequencing.

In addition to utilizing materials such as silicon, HSQ and gold, other combinations of materials can provide similar results so long as the metal has poor wetting properties with the nano-features on the template and the nano-features are capable of withstanding the elevated temperatures of metal dewetting. Examples include silicon nanopillars 122 with silver, aluminium or copper films 132. In addition, the film may not be restricted to metals and/or the method may not be restricted to apertures in metal films. This method may also be applicable to dewetting of non-metal films (e.g. polymers) from nanopatterned templates to produce apertures in films of other materials.

Thus, referring back to the illustration 100 of the fabrication method, the template fabrication step 110 includes fabricating the template 120 where the protruding nanostructures 122 such as nanopillars and nanolines are formed in order to obtain round nanoholes and nano-trenches, respectively, in the metal film 132. The template 120 can be fabricated using methods such as electron beam lithography or, for high throughput, nanoimprint lithography. For example, the nanopillars 122 can be defined with electron beam lithography using a high resolution negative resist such as HSQ on a silicon substrate.

The metal deposition step 130 deposits the metal 132 to a thickness 134 that is approximately equivalent to the height 136 of the template nano structures. For example, electron beam evaporation can be used to deposit the metal 132, such as gold. Other materials and other methods of metal deposition (e.g. sputtering or conformal coating) may also be utilized in accordance with the present embodiment.

The metal dewetting 140 is induced by heating up the sample. During the dewetting 140, metal 142 on top of protrusions in the nanopatterned template reflows from these protrusions into the surrounding metal film 132. As a result, the nanoapertures 150 are obtained at the locations of these protrusions. The size, shape and location of the nanoapertures 150 are determined by the size, shape and location of the nanoscale protrusions 122. Thermal dewetting 140 in accordance with the present embodiment can be induced with bottom heating on a hotplate at 250° C. for fifteen minutes or can be induced by all-around heating in a rapid thermal processor at 400° C. for five to ten minutes. The exact time and temperature of heating can vary with metal thickness and/or desired aperture size. The time and temperature can be determined by further optimization, by experimentation and/or with simulations using an algorithm in accordance with another aspect of the present embodiment.

Where empty apertures are desired rather than the apertures 150 filled with the template material, the template can be removed by methods such as etching or milling. Such methods are gentle and high yield processes as compared to metal lift-off since the metal reflow off the template allows for direct access of chemicals and ion species to the template material in the apertures 150.

In the phase field model in accordance with the present embodiment, four long-range order parameters: $\eta_1(r)$, $\eta_2(r)$, $\eta_3(r)$, and $\eta_4(r)$ are employed to denote the whole system, with r being a position vector of a point. The total free energy is expressed as a function of these order parameters, e.g. $[\eta_1, \eta_2, \eta_3, \eta_4]=[1,0,0,0]$ in the vacuum phase, $[\eta_1, \eta_2, \eta_3, \eta_4]=[0,1,0,0]$ in the metal phase, $[\eta_1, \eta_2, \eta_3, \eta_4]=[0,0,1,0]$ in the substrate phase, and $[\eta_1, \eta_2, \eta_3, \eta_4]=[0,0,0,1]$ in the template phase, with a constraint $\Sigma_{i=1}^{4}\eta_i=1\Sigma_{i=1}^{4}\eta_i=1$ throughout the entire simulation region. The coarse-grained Ginzburg-Landau free energy of the multiphase system, including bulk free energy, surface energies and interfacial energy, is modelled using the following free-energy function $$F^{tot}=\int[\Sigma_{i\neq j}(\alpha_{ij}\eta_i^2\eta_j^2+K_{ij}\nabla\eta_i\nabla\eta_j)]dV \quad (1)$$

where $\alpha_{ij}$ are constants related to the height of the double-well potential and $K_{ij}$ are the gradient energy coefficients. These two parameters together determine the surface/interface energy density as:

$$\xi_{ij}=\sqrt{2\alpha_{ij}K_{ij}}/3 \quad (2)$$

To simplify the evolution equation, we assume that the phase field $\eta_3$ and $\eta_4$ describing the evolution of the silicon substrate and the HSQ nanopillars are static, i.e., it does not evolve with time. Since $\Sigma_{i=1}^{4}\eta_i=1\Sigma_{i=1}^{4}\eta_i=1$, we choose $\eta_2$ as an independent phase field and its evolution follows the Cahn-Hilliard equation $$\frac{\partial \eta_2}{\partial t} = \nabla L \nabla \frac{\delta F^{tot}}{\delta \eta_2} \quad (3)$$

where, L is the mobility. Equation (3) is solved in its non-dimensional form:

$$\frac{\partial \eta_2}{\partial t^*} = \Delta^* \frac{\delta F^{tot*}}{\partial \eta_2} \quad (4)$$

$$F^{tot*} = \int [\Sigma_{i\neq j}(a_{ij}^*\eta_i^2\eta_j^2 + K_{ij}^*\nabla^*\eta_i\nabla^*\eta_j)]dV \quad (5)$$

Where $t^*=t\cdot f_0 L/\Delta x^2$, $F^{tot*}=F^{tot}/f_0$, $\alpha^*_{ij}=\alpha_{ij}/f_0$, $K^*_{ij}=K_{ij}/f_0\Delta x^2$, $\Delta^*=\Delta\cdot\Delta x^2$, $\nabla^*=\nabla\cdot\Delta x$. Here, $\Delta x$ and $f_0$ are length scale and energy scale, respectively. Equation (4) is solved using Fourier-Spectral method with $\Delta x^*=1$ and $\Delta t^*=0.2$.

Figure 2:
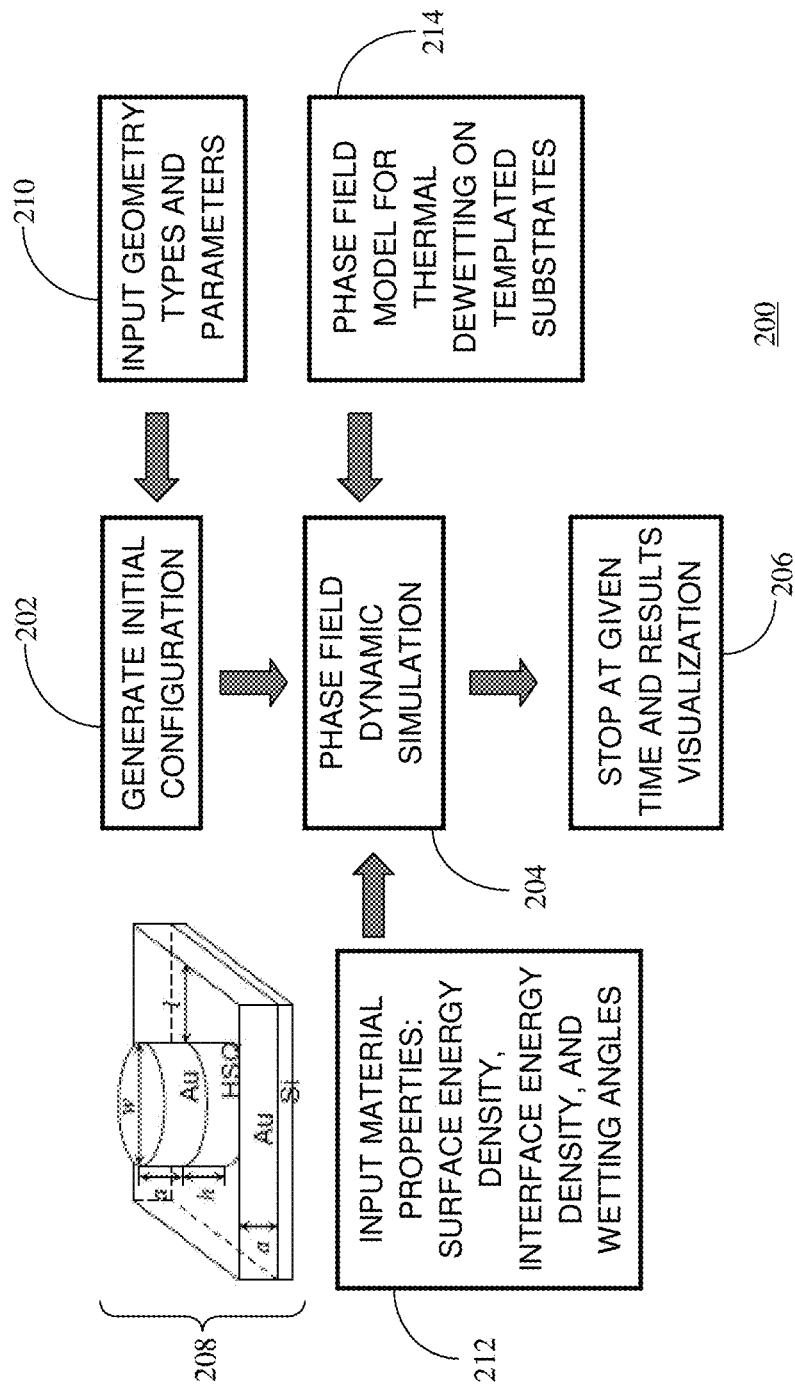
FIG. 2 illustrates a process for simulation of the nanoaperture fabrication process of FIG. 1 in accordance with the present embodiment.

Referring to FIG. 2, a diagram 200 illustrates a process for simulation of the nanoaperture fabrication process of FIG. 1 in accordance with the present embodiment. The algorithm generates 202 matrices representing the simulation geometry. Next, these matrices are passed on into a phase field dynamic simulation routine 204. The simulation can be stopped at stipulated times to convert 206 the matrices into three-dimensional geometries in order to visualize the outcomes of the simulation.

The geometry of the deposited metal film on the nanopattern template 208 is generated and converted into matrices in the form required by the phase field model 214. The geometry type and detailed geometry parameters are required inputs 210 for step 202. In accordance with the present embodiment, a "0" is used to represent a non-templated substrate, a "1" is used to represent a template that consists of a nanopillar array, and a "2" is used to represent a nanotube array. Other geometry types can also be defined.

Different geometry types require different input parameters. For example, nanopillar arrays require parameters such as the height and diameter of the nanopillars and the period of the array. For all template configurations, film thickness and surface roughness of the film are required inputs. In accordance with the present embodiment, generation of complex templates consisting of a mix of nanopillars, and nanowires, for example, may also be permitted.

The system geometry is represented by four matrixes: $\varphi_1$, $\varphi_2$, $\varphi_3$ and $\varphi_4$, where $[\varphi_1, \varphi_2, \varphi_3, \varphi_4]=[1,0,0,0]$ represents the vapor phase, $[\varphi_1, \varphi_2, \varphi_3, \varphi_4]=[0,1,0,0]$ represents the metal film phase, $[\varphi_1, \varphi_2, \varphi_3, \varphi_4]=[0,0,1,0]$ represents the (flat) substrate phase and $[\varphi_1, \varphi_2, \varphi_3, \varphi_4]=[0,0,0,1]$ represents the (protruding) template phase. After generating the initial geometry 202, these four matrixes are then transferred into the main module 204 of the phase field dynamic simulation.

Next, the dynamic phase field simulation is performed. This simulation requires inputs 212 of material properties, including surface energy density of all materials and interface energy density between them, wetting angles of the film on the substrate and on the template. The phase field simulation algorithm consists of a) a calculation of surface energies of the metal film, the substrate and the template, and the interface energies between them according to the current distribution of the film and the geometry of the template; b) setting and considering the boundary conditions; c) calculation of the chemical potential of the film; and d) obtaining the kinetic evolution of the film according to the free energy, chemical potential and boundary conditions. The simulation will then be recorded or stopped at each time step, and matrixes of each field, $\varphi_1$, $\varphi_2$, $\varphi_3$ and $\varphi_4$, will then be extracted and visualized 206 to show the evolution.

Thus, in accordance with the present embodiment, a highly scalable method to obtain nanoapertures at the resolution of approximately ten nanometers and below is provided. In addition to the clear advantage in achievable minimum feature size, defining nanoapertures by thermal dewetting of metal off a pre-patterned template is simple, highly controllable and very cost effective.

The minimum feature size achievable in accordance with the present embodiment is limited only by the method used to define the nanopatterned template. Because the thickness of the template structures need only be as tall as the desired metal thickness (unlike in metal lift-off processes where the template needs to be approximately three times as thick to ensure good yield), resolution deterioration correlating to an increase in resist thickness is much less significant here. In addition, fabrication in accordance with the present embodiment allows high aspect ratio fabrication without the need for even higher aspect ratio template structures that are problematic to manufacture. In addition, since the method does not involve ion milling, there is no problem of ion contamination.

Finally, the fabrication method in accordance with the present embodiment is cost effective and highly scalable. As described in the illustration 100, the fabrication method includes of three steps—template patterning 110, metal deposition 130 and heating 140. The template patterning 110 can be performed via nanoimprinting which is now capable of sub-fifteen nanometer patterning and is increasingly becoming a viable mass manufacturing process. The metal deposition process 130 is done in an evaporator and can conceivably be performed by electroplating or sputtering, processes that are more compatible with standard industry processes. And the thermally induced dewetting process 140 can be performed even on a conventional hotplate set at 250 degree Celsius.

The phase field simulations have demonstrated that the dewetting process 140 is very reproducible because the process 140 is kinetically favorable. Fabrication in accordance with the present embodiment has obtained >90% yield over an area of >2 by 2 microns and the process yield is mainly limited by the sturdiness of the nanopillars used which can be improved with resist and surface optimization.

The fabrication method in accordance with the present embodiment also advantageously requires no physical agitation, unlike methods involving metal lift-off. Thus, metal adhesion is not a prerequisite. Adhesion of gold, for example, is poor on common substrates such as glass and silicon, often requiring an adhesion layer (e.g. titanium or chromium). The presence of the adhesion layer makes device design and performance prediction complicated. For example, the adhesion layer changes the Schottky barrier height and, in plasmonic applications, the presence of the adhesion layer dampens surface plasmons, thereby deteriorating the performances of the device.

A further advantage of the fabrication process in accordance with the present embodiment is that the template materials are not removed during the fabrication process. Rather, the metal on top of the nanopattern simply dewets off, revealing the apertures 150. As such, it is conceivable that the template materials can consist of active materials such as semiconductors, nonlinear materials, phase change materials and other similar active materials which can provide active control of the devices made through this method. The dewetting process will also allow for close interfacing while allowing for optical or electrical access to these active materials.

However, where clear apertures are desired, the template material can be removed with dry or wet etching. This would still be a more desirable process than metal lift-off or dry/wet etching of metal because the yield and minimum achievable feature size of this process is not fundamentally affected by the limitations of the processes 110, 130, 140 as described herein.

Figure 3:
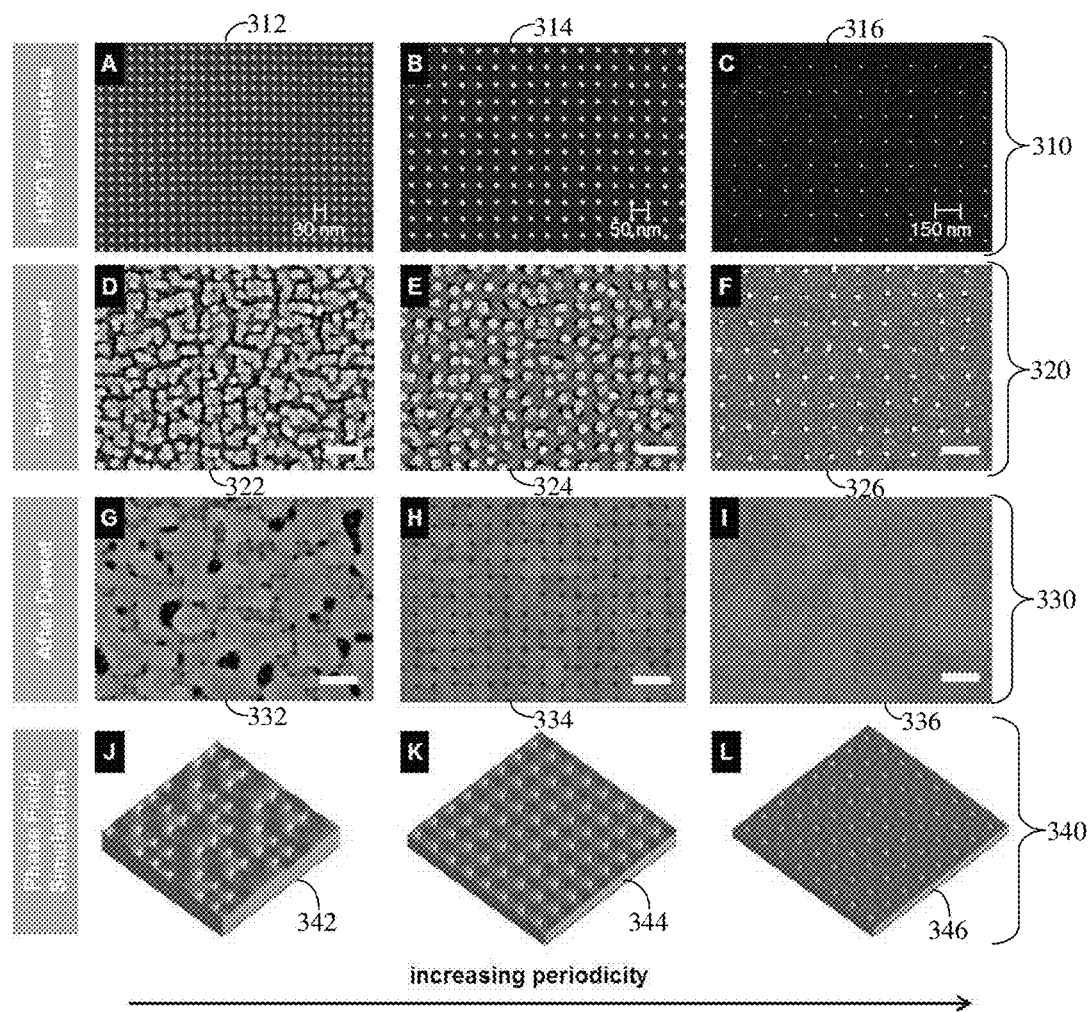
FIG. 3 illustrates fabricated products and partially fabricated products from the nanoaperture fabrication process of FIG. 1 depicting the effect of nanopillar spacing in accordance with the present embodiment.

Referring to FIG. 3 illustrates fabricated products and partially fabricated products from the nanoaperture fabrication process in accordance with the present embodiment and depicts the effect of nanopillar spacing in the fabrication process wherein the periodicity (i.e. spacing) of the apertures increases from left to right. A first row 310 depicts HSQ defined sub-15 nm wide pillars on bare silicon wherein image 312 has the nanopillars spaced 30 nm apart, image 314 has the nanopillars spaced 50 nm apart and image 316 has the nanopillars spaced 150 nm apart. A second row 320 depicts nanostructures after metal deposition wherein image 322 has the nanopillars spaced 30 nm apart, image 324 has the nanopillars spaced 50 nm apart and image 326 has the nanopillars spaced 150 nm apart.

A third row 330 depicts nanostructures after dewetting wherein image 332 depicts dewetting where the nanopillars are spaced 30 nm apart, image 334 depicts dewetting where the nanopillars are spaced 50 nm apart and image 336 depicts dewetting where the nanopillars are spaced 150 nm apart. Note that in the image 332 unsuccessful dewetting has occurred because the nanopillars are too close to one another. In the images 334, 336, metal successfully dewets off the nanopillars resulting in clear nano-apertures. A fourth row 340 depicts three-dimensional phase filed simulation results with image 342 depicting a pillar periodicity of 30 nm, image 344 depicting a pillar periodicity of 50 nm and image 346 depicting a pillar periodicity of 150 nm to show the close resemblance of the simulation results to experimental results.

Figure 4:
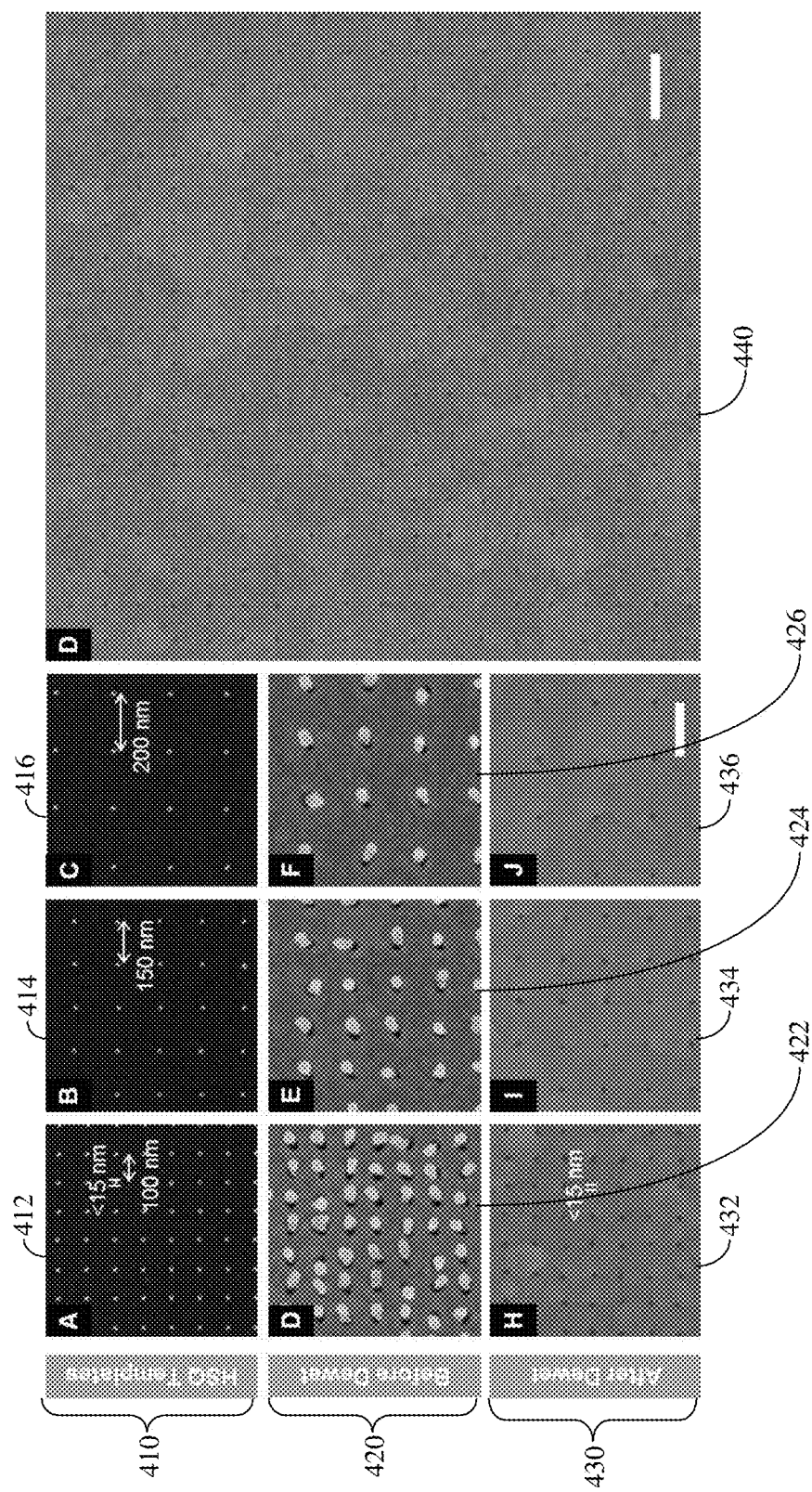
FIG. 4 illustrates fabricated products and partially fabricated products from the nanoaperture fabrication process of FIG. 1 where subfifteen nanometer nanoapertures are fabricated in sixty nanometer gold film in accordance with the present embodiment.

FIG. 4 illustrates fabricated products and partially fabricated products from the nanoaperture fabrication process in accordance with the present embodiment where subfifteen nanometer nanoapertures are fabricated in sixty nanometer gold film. A first row 410 depicts HSQ defined nanostructures on bare silicon with image 412 depicting a pillar periodicity of 100 nm, image 414 depicting a pillar periodicity of 150 nm and image 416 depicting a pillar periodicity of 200 nm. A second row 420 depicts structures after metal deposition with image 422 depicting a pillar periodicity of 100 nm, image 424 depicting a pillar periodicity of 150 nm and image 426 depicting a pillar periodicity of 200 nm. A third row 430 depicts nano-apertures obtained after thermally-induced dewetting with image 432 depicting a pillar periodicity of 100 nm, image 434 depicting a pillar periodicity of 150 nm and image 436 depicting a pillar periodicity of 200 nm. A high magnification SEM image 440 shows a close-up of the nano-apertures of the image 436.

Figure 5:
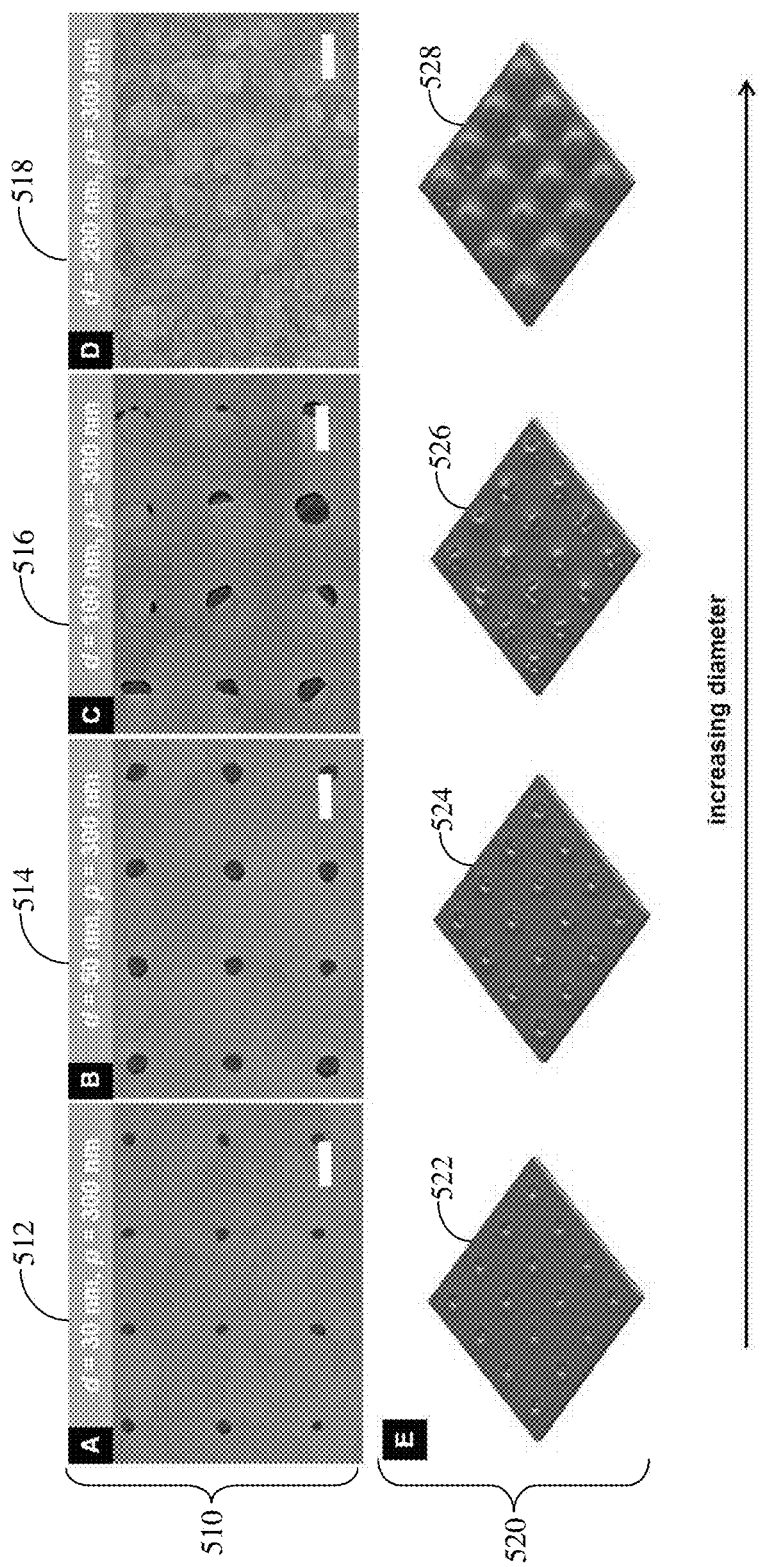
FIG. 5 illustrates circular nanoapertures of increasing diameters fabricated using the nanoaperture fabrication process of FIG. 1 in accordance with the present embodiment.

FIG. 5 illustrates circular nanoapertures of increasing diameters having a periodicity of 300 nm and fabricated using thermally-induced dewetting of the nanoaperture fabrication process in accordance with the present embodiment. A first row 510 of experimental results includes image 512 depicting circular nanoapertures having a diameter of 30 nm, image 514 depicting circular nanoapertures having a diameter of 50 nm, image 516 depicting circular nanoapertures having a diameter of 100 nm and image 518 depicting circular nanoapertures having a diameter of 200 nm A second row 520 of three-dimensional simulation results includes image 522 depicting circular nanoapertures having a diameter of 30 nm, image 524 depicting circular nanoapertures having a diameter of 50 nm, image 526 depicting circular nanoapertures having a diameter of 100 nm and image 528 depicting circular nanoapertures having a diameter of 200 nm.

Thus it can be seen that the fabrication process in accordance with the present embodiment can be applied to structures with a minimum pitch size of 50 nm for a metal thickness of 30 nm and a pitch size of 100 nm for a metal thickness of 60 nm. This limitation is determined by two factors: the metal grain size cause joining of adjacent metal caps before dewetting and the energetic favorability of the final configuration considering surface and interfacial energies of the materials involved. From the image 322, when the metal caps are joined, the metal fails to completely dewet from the nanopillars. These metal caps are significantly larger than the nanopillars beneath them because of the large grain size of the evaporated metal and also metal diffusion during the evaporation process. These may result in a shadowing effect such that the metal is insufficiently deposited on the substrate in their vicinities.

In addition, the phase field simulation method was shown to accurately predict the experimental fabrication method outcome. In the simulation image 342 where we assume that the metal caps atop nanopillars are distinct even at small pitch sizes, the templates at small pitch sizes are fundamentally energetically unfavorable for complete dewetting. With increasing pitch sizes, the simulations 344, 346 predict complete dewetting consistent with the experimental findings.

In addition, the versatility of this technique for the fabrication of larger nanoapertures has been demonstrated with nanoapertures up to 50 nm in diameter in 30 nm thick gold films can be achieved. Although both experiments and simulations support evidence of incomplete dewetting at large diameters with respect to periodicity over the time course of the thermal treatment, simulations show that these apertures can form with longer treatment times or at higher temperatures, as long as the periodicity of the apertures is larger than about four times the diameter.

Figure 6:
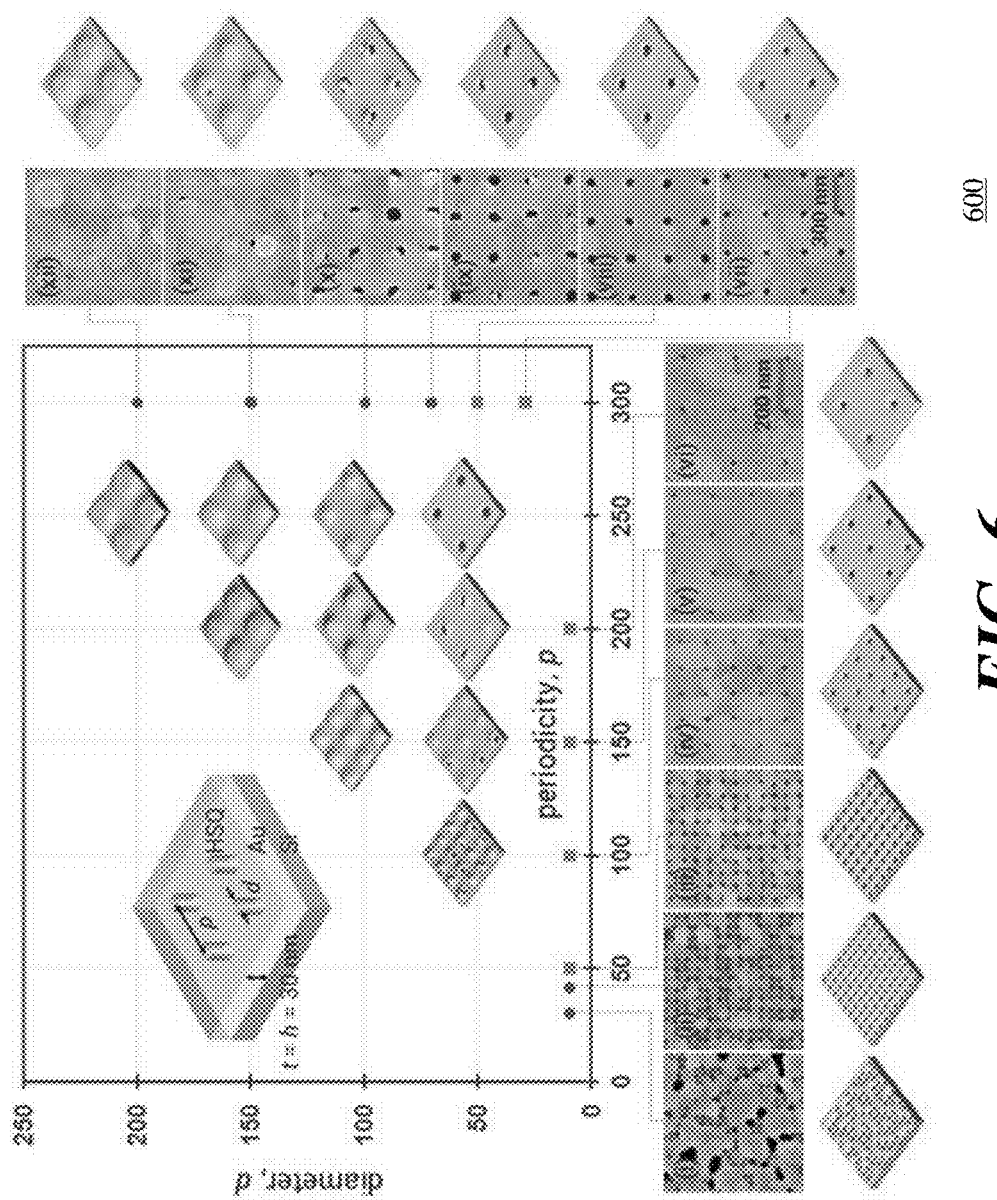
FIG. 6 illustrates a graph with drawings in a combined illustration depicting the effect of nanopillar spacing and the effect circular nanoapertures of increasing diameters in accordance with the present embodiment.

Further simulations and experiments over the entire parameter space for a film thickness of 30 nm shown as a combined diagram and graph 600 in FIG. 6 supports this observation. Experimental results are shown in the illustration 600 for a diameter d of the circular nanoapertures being approximately ten nanometers (10 nm) with periodicity p of the nanopillar spacing equal to 30 nm, 40 nm, 50 nm, 100 nm, 150 nm, and 200 nm; and a periodicity p being 300 nm with diameter d equaling 30 nm, 50 nm, 70 nm, 100 nm, 150 nm, and 200 nm, respectively. Simulation results were obtained for the entire parameter space. Experimental parameters for which nanoaperture arrays were achieved are marked by squares, whereas parameters with which dewetting fails to produce aperture arrays are indicated by dots. Thus it can be seen that nanoaperture arrays can be achieved when the nanoaperture diameter is 50 nm or less and when the nanopillar periodicity is 50 nm or greater.

Figure 7:
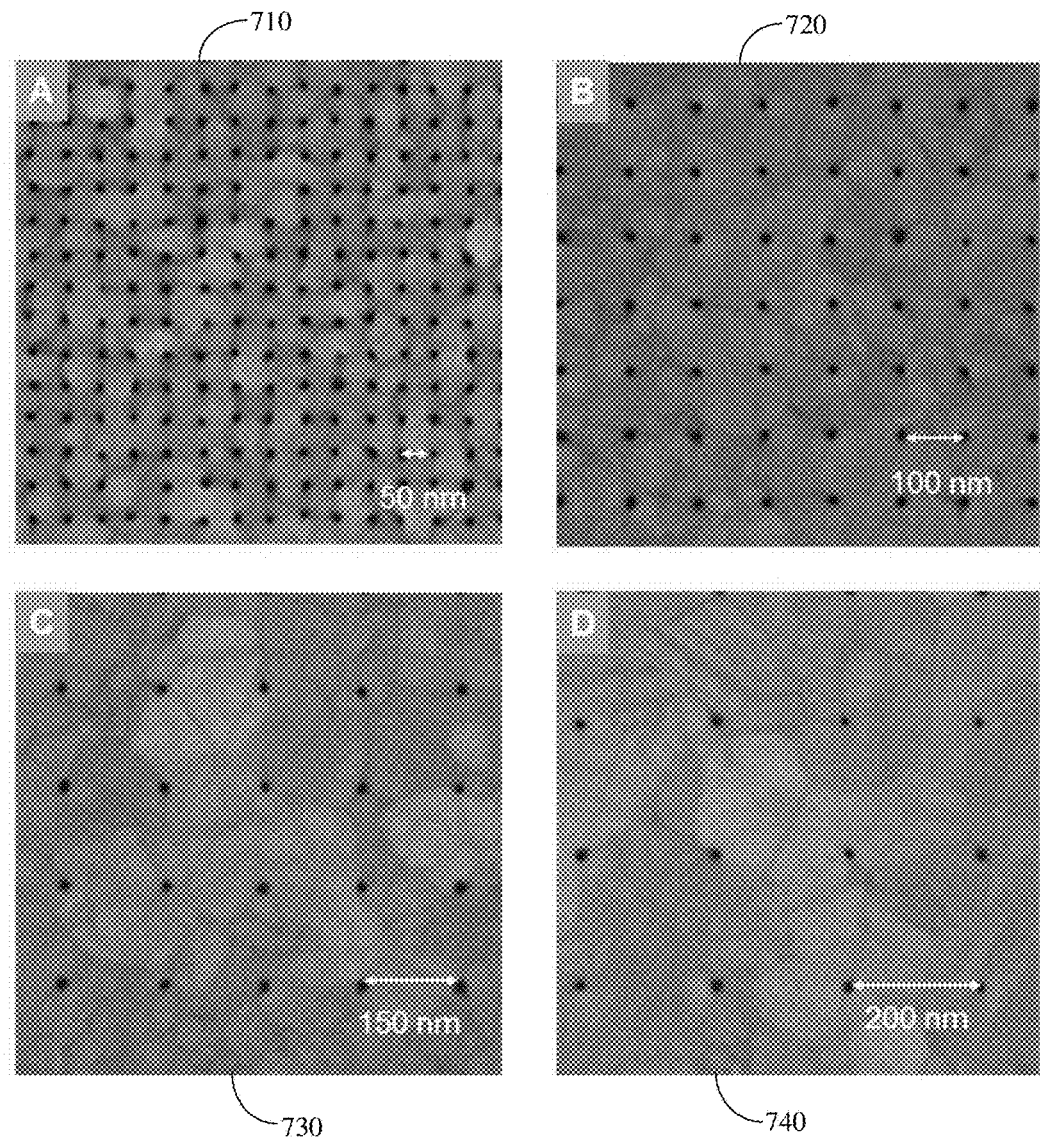
FIG. 7 illustrates nanoaperture fabrication in accordance with the present embodiment using a hotplate.

Referring to FIG. 7, nanoaperture fabrication in accordance with the present embodiment by dewetting of metal off nanopillars using a hotplate is depicted. A conventional laboratory hotplate was set at 250 degrees Celsius for fifteen minutes to inducing dewetting and image 710 depicts a post dewetting sample having a nanoaperture periodicity of 50 nm, image 720 depicts a post dewetting sample having a nanoaperture periodicity of 100 nm, image 730 depicts a post dewetting sample having a nanoaperture periodicity of 150 nm and image 740 depicts a post dewetting sample having a nanoaperture periodicity of 200 nm.

The fabrication process in accordance with the present embodiment can be used to fabricate plasmonic devices utilizing the phenomenon of extraordinary transmission (EOT). In EOT, the transmission of a particular wavelength of electromagnetic wave through nanoaperture arrays in opaque metal films can be highly enhanced. The peak transmission wavelength is highly correlated to the periodicity of the aperture array. This phenomenon has been shown to be useful in chemical and biological sensing. While conventional methods to fabricate such devices are not amenable for mass production, nanoaperture array fabrication in accordance with the present embodiment provides a simple, high throughput and cost effective manufacturing method that is instrumental to commercial viability of EOT technologies.

The present method also allows for smaller achievable minimum feature sizes (smaller apertures) than what is practically achievable with conventional methods. This is also indicative that the present method should be able to achieve small periodicity, allowing for EOT devices at deep UV and soft x-ray ranges. In addition, the present method inherently allows for the template material to remain in the apertures. This is conceivably highly advantageous in scenarios where the templates consist of active materials (e.g. phase change material) such that the electromagnetic response of the plasmonic material can be tuned via the active materials, and where the templates consist of chemically or biologically active or adherent materials such that the apertures can provide chemically or biologically sensing capabilities.

In applications where vacant apertures are desired, the template material can be easily etched away with wet or dry etching methods. This can be done at high yields since the metal caps are already removed from the protruding nanotemplates, allowing chemical and/or physical access for etching. Such solid state nanopores could enable devices for DNA sequencing.

In these methods, DNA passing through the nanopores may elicit electrical signatures (disruption in current for cases where the nanopore membranes are charged) or optical signatures (complementary strand with optical probes dissociate from parent strand emit fluorescence that is optically detected). Nanopores are also useful for ultra-small volume chemical and biological sensing. In these cases, the smaller the nanopores, the higher the concentration of solutions possible while still maintaining single-molecule sensing (assuming adequate signal). The present fabrication method is particularly useful in cases of optical detection were the fluorescence signal can be enhanced through plasmonic phenomena, such as EOT as described above.

There is a lack of materials for refractive optical elements in the soft x-ray wavelengths. Diffractive optical elements are, thus, sometimes used to manipulate soft x-ray beams. The minimum feature size required of such elements is approximately 10s of nanometers. The present method can be used as a cost effective manufacturing method for these diffractive elements.

Thus, it can be seen that the present embodiment can provide a high throughput, high yield, additive fabrication method which allows for high-resolution nanofabrication of nano-apertures in metal films via thermally-induced metal dewetting guided by nanopatterned templates. The present method relies on a combination of surface diffusion and reflow of metal features on top of nano-patterned protrusions into the surrounding metal film at elevated temperatures and also relies on the lowered melting temperature of metals in the nanoscale due to the high surface to high surface to volume ratio. The metal reflows completely from the nano-patterned protrusions into the surrounding metal film, revealing apertures where the nano-patterned protrusions are on the template. Thus, the shape, sizes and locations of these nanoapertures are determined by that of the nano-patterned protrusions. The dewetting process is thermally induced, i.e. heating is required to perturb the system and provide energy for metal diffusion and reflow. There is no limitation on the mode of thermal treatment as long as enough energy is put into the system. The minimum feature size achievable by this method can be less than 10 nm and is mainly limited by the resolution of the methods used for template definition. The fabricated patterned metal films have high crystallinity, an advantageous feature for electric and plasmonic devices and the present fabrication method is translatable to a range of different substrates and metals.

In addition, the present embodiment provides a complementary energetic analysis and phase-field stimulations method that can accurately predict the fabrication yield and provide guidelines for optimal fabrication parameters. Further, the present fabrication method does not remove materials to obtain apertures, unlike existing methods like etching, milling and metal lift-off. Instead, metal reflows away from the protrusions in the template, which can be defined by methods such as lithography or nanoimprinting. This also allows for easy interfacing with active nanostructures, where the active nanostructures (e.g. quantum dots, phase-change materials, nonlinear crystals) serve as nano-templates. Through the process of dewetting, close interfacing to the active materials can be achieved by providing optical and electrical access to these materials. While exemplary embodiments have been presented in the foregoing detailed description of the invention, it should be appreciated that a vast number of variations exist.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A method for fabrication of metal film with nanoapertures comprising:
   defining a plurality of nanopillars on a nanopatterned template;
   depositing the metal film onto the nanopatterned template; and
   thermally induced dewetting of the metal film to define the nanoapertures in the metal film by diffusion and reflow of the metal film.

2. The method in accordance with claim 1 wherein the step of thermally induced dewetting comprises bottom heating the template with the metal film.

3. The method in accordance with claim 2 wherein the bottom heating the template with the metal film comprises bottom heating the template with the metal film at substantially 250 degrees Celsius for approximately fifteen minutes.

4. The method in accordance with claim 1 where the step of thermally induced dewetting comprises all around heating the template with the metal film.

5. The method in accordance with claim 4 wherein the step of all around heating the template with the metal film comprises all around heating the template with the metal film in a rapid thermal processor.

6. The method in accordance with claim 4 wherein the step of all around heating the template with the metal film comprises all around heating the template with the metal film at substantially 400 degrees Celsius for between approximately five to ten minutes.

7. The method in accordance with claim 1 wherein the step of thermally induced dewetting comprises top heating the template with the metal film.

8. The method in accordance with claim 1 wherein the step of defining the plurality of nanopillars comprises defining the plurality of nanopillars on the template by nanoimprinting.

9. The method in accordance with claim 1 wherein the step of defining the plurality of nanopillars comprises defining the plurality of nanopillars on the template by nanolithography.

10. The method in accordance with claim 1 wherein the step of thermal induced dewetting comprises metal diffusing and reflowing the metal film for interfacing the nanopillars with metal within the nanoapertures in the metal film.

11. A method for fabrication of metal film with nanoapertures comprising:
    defining a plurality of nanostructures on a nanopatterned template, wherein the plurality of nanostructures comprise active materials selected from the group consisting of quantum dots, nonlinear crystals, epitaxially grown semiconductor nanostructures and nanowires;
    depositing the metal film onto the nanopatterned template;
    thermally induced dewetting of the metal film to define the nanoapertures in the metal film by diffusion and reflow of the metal film, wherein the step of thermal induced dewetting comprises metal diffusing and reflowing the metal film for interfacing the nanostructures with metal within the nanoapertures in the metal film; and
    providing a connection to the active materials to provide active control of a device comprising the metal film.

12. The method in accordance with claim 11 wherein the providing a connection step comprises providing a connection to the active nano-template materials by one of an optical connection or an electrical connection.

13. The method in accordance with claim 12 wherein the method further comprises utilizing the device for plasmonics and/or metal optics applications.

14. The method in accordance with claim 13 wherein the step of utilizing the device for plasmonics and/or metal optics applications comprises utilizing the device as a transmission based device operating at an ultrashort wavelength less than two hundred nanometers.

15. A method for fabrication of metal film with nanoapertures comprising:
 providing a nanopatterned template comprising a plurality of nanostructures;
 depositing the metal film onto the nanopatterned template;
 thermally induced dewetting of the metal film to define the nanoapertures in the metal film by diffusion and reflow of the metal film; and
 removing the nanostructures from the nanoapertures of the metal film such that the nanoapertures operate as nano-sieves, nanopores or nanoholes for biosensing and/or DNA sequencing.

* * * * *